(12) United States Patent
Dolinsky

(10) Patent No.: US 9,164,144 B2
(45) Date of Patent: Oct. 20, 2015

(54) CHARACTERIZATION AND CALIBRATION OF LARGE AREA SOLID STATE PHOTOMULTIPLIER BREAKDOWN VOLTAGE AND/OR CAPACITANCE

(71) Applicant: General Electric Company, Schenectady, NY (US)

(72) Inventor: Sergei Ivanovich Dolinsky, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 192 days.

(21) Appl. No.: 13/727,959

(22) Filed: Dec. 27, 2012

(65) Prior Publication Data

US 2014/0184197 A1    Jul. 3, 2014

(51) Int. Cl.
| | |
|---|---|
| G01R 15/24 | (2006.01) |
| G01R 31/28 | (2006.01) |
| G01T 1/20 | (2006.01) |
| G01T 1/208 | (2006.01) |
| G01J 11/00 | (2006.01) |
| G01J 1/42 | (2006.01) |

(52) U.S. Cl.
CPC ........... *G01R 31/2837* (2013.01); *G01J 1/4228* (2013.01); *G01J 11/00* (2013.01); *G01T 1/208* (2013.01); *G01T 1/2018* (2013.01)

(58) Field of Classification Search
USPC .......................................................... 324/96
See application file for complete search history.

(56) References Cited

U.S. PATENT DOCUMENTS

| | | | |
|---|---|---|---|
| 2,474,098 A * | 6/1949 | Dimmick ....................... | 356/325 |
| 5,909,306 A | 6/1999 | Goldberg et al. | |
| 6,362,472 B1 | 3/2002 | Yarnall et al. | |
| 7,723,694 B2 | 5/2010 | Frach et al. | |
| 8,017,906 B2 | 9/2011 | Nelson et al. | |
| 2006/0175529 A1* | 8/2006 | Harmon et al. ............... | 250/207 |
| 2008/0156993 A1* | 7/2008 | Weinberg et al. ......... | 250/363.03 |
| 2008/0240341 A1* | 10/2008 | Possin et al. ................... | 378/19 |
| 2010/0065746 A1 | 3/2010 | Grazioso et al. | |
| 2011/0012012 A1 | 1/2011 | Stein et al. | |
| 2011/0108702 A1 | 5/2011 | Jackson et al. | |

(Continued)

FOREIGN PATENT DOCUMENTS

| | | |
|---|---|---|
| EP | 2360493 A1 | 8/2011 |
| WO | 2011117309 A2 | 9/2011 |

OTHER PUBLICATIONS

Sun, Xishan, et al., Study of maintaining stable SSPM-based detector gain by active bias control, IEEE Nuclear Science Symp. and Med. Imag. Conf. Record (NSS/MIC), 2012, p. 405-408.*

Eidelman et al., "Particle Detectors", Physics Letters-PDG (Particle Data Group), vol. 592, Issue 1, May 31, 2006.

(Continued)

*Primary Examiner* — Thomas F Valone
(74) *Attorney, Agent, or Firm* — Robert M. McCarthy

(57) ABSTRACT

Exemplary embodiments are directed to characterizing a solid state photomultiplier (SSPM). The SSPM can be exposed to a light pulse that triggers a plurality of microcells of the SSPM and an output signal of the SSPM generated in response to the light pulse can be processed. The output signal of the SSPM can be proportional to a gain of the SSPM and a quantity of microcells in the SSPM and a value of an electrical parameter of the SSPM can be determined based on a relationship between the output signal of the SSPM and an over voltage applied to the SSPM.

16 Claims, 6 Drawing Sheets

(56) References Cited

U.S. PATENT DOCUMENTS

| | | |
|---|---|---|
| 2011/0220802 A1 | 9/2011 | Frisch et al. |
| 2012/0228484 A1 | 9/2012 | Burr |
| 2013/0009047 A1* | 1/2013 | Grazioso et al. ............ 250/252.1 |
| 2013/0099346 A1* | 4/2013 | Choong et al. ................ 257/437 |
| 2013/0249035 A1* | 9/2013 | Hedler et al. ................. 257/432 |
| 2013/0313414 A1* | 11/2013 | Pavlov et al. .............. 250/214.1 |
| 2014/0183339 A1* | 7/2014 | Dolinsky ................... 250/208.2 |

OTHER PUBLICATIONS

Dolinsky, Novel approach for calibration breakdown voltage of large area SiPM, International Workshop on New Photon-detectors, Jun. 13-15, 2012.

* cited by examiner

CHARACTERIZATION AND CALIBRATION OF LARGE AREA SOLID STATE PHOTOMULTIPLIER BREAKDOWN VOLTAGE AND/OR CAPACITANCE

BACKGROUND

The Silicon Photomultiplier (SiPM) is multipixel (multi-SPAD) silicon photodiode with a number up to a few thousand independent micropixels (with typical size of 10-100 um) joined together on common substrate and working on common load. Each pixel detects the photoelectrons with a gain of about $10^6$. Solid state photomultipliers (SSPMs), which are also commonly referred to as MicroPixel Photon Counters (MPPC) or MicroPixel Avalanche Photodiodes (MAPD) have become popular for use as photosensors. For example, SSPMs have been employed in scintillator based nuclear detectors. Typically, SSPMs are implemented as Silicon Photomultipliers (SiPM).

The gain of an SSPM operating in Geiger mode is proportional to the overvoltage ($V_{ov}$), e.g., the difference between the applied bias voltage ($V_{bias}$) and breakdown voltage ($V_{br}$). The Geiger mode process typically results in a well defined single photo electron (SPE) pulses, which can be used to identify breakdown voltage $V_{br}$ and the capacitance ($C_{u\text{-}cell}$) of individual microcells. Conventional approaches have typically utilized intrinsic dark counts or very short, low intensity light pulses (e.g., with an average of 0.1 to 1 detected photon) to detect SPE pulses. That is, the intensity of light pulses is typically specified to trigger on average 0.1 to 1 u-cell per pulse. These conventional approaches work well for small devices (e.g., ~1 mm$^2$) and when the dark count rate is small. However, for many SSPM-based detector applications, e.g. a PET scanner, larger SSPMs are constructed (e.g., with a typical size of 10-100 mm$^2$).

While SSPMs have a good single photoelectron pulse (SPE) response to low intensity light that can be used for absolute calibration and defining the breakdown voltage, it becomes increasingly difficult to measure SPE pulses as the size of an SSPM increases. One reason for this can be attributed to an increase in dark counts as the size of an SSPM increases. Moreover, conventional approaches to SPE calibration are typically implemented with a high gain low noise amplifier, which can prohibit use readout electronics designed for detection of relatively large signals from scintillators. Therefore, conventional SPE calibration approaches are generally unavailable for calibrating a fully assembled SSPM-based detector using the detectors readout electronics. Even if an SSPM-based detector includes an application specific integrated circuit (ASIC) with a special high gain mode for the calibration, the high dark count rate can still present a challenge to use of SPE pulses to calibrate large area SSPMs.

SUMMARY

Exemplary embodiments of the present disclosure are directed to characterizing and calibrating electrical parameters (e.g., a breakdown voltage and/or capacitance) of large area solid-state photomultiplier (SSPM) based on short high intensity light pulses. Exemplary embodiments can provide a simple and robust approach to determining the electrical parameters without requiring high gain amplifiers to process the output of the SSPM.

Exemplary embodiments of the present disclosure can advantageously be used with front-end electronics designed for PET detectors, can allow for the investigation of linear and avalanche (non-Geiger regime) modes, and can allow for evaluating the break down avalanche process of an SSPM as well as a transition of the SSPM into a Geiger mode of operation.

It has been recognized by the inventor that a small over voltage for SSPMs results in a small gain of the SSPM and that the contribution of preamplifier noise is significant. The inventor has also recognized that utilizing a small over voltage can make it difficult to measure pulses corresponding to a single photoelectron pulse (SPE). The inventor has further recognized that, at higher over voltages, increased dark counts and a high probability of after pulses can make it difficult to isolate SPE events.

In one embodiment, a method of characterizing a solid state photomultiplier (SSPM) is disclosed. The method includes exposing the SSPM to a light pulse that triggers a plurality of microcells of the SSPM and processing an output signal of the SSPM generated in response to the light pulse. In some embodiments, a substantial quantity or all of the microcells can be triggered by the light pulse. The output signal is proportional to a gain of the SSPM and a quantity of microcells in the SSPM. The method also includes determining a value of an electrical parameter of the SSPM based on a relationship between the output signal of the SSPM and an over voltage applied to the SSPM.

In another embodiment, a system for determining an electrical parameter of a solid state photomultiplier is disclosed. The system includes a light source, circuitry, and a processing device. The light source is configured to emit light pulses at different intensities towards a solid state photomultiplier to trigger microcells in the SSPM. The circuitry is configured to process an output signal of an SSPM. The output signal is proportional to a gain of the SSPM and a quantity of microcells in the SSPM. The processing device is programmed to control emission of the light pulses from the light source and control processing of the output signal by the circuitry. The processing device is further programmed to determine an electrical parameter of the SSPM based on a relationship between the output signal of the SSPM and a bias voltage applied to the SSPM.

In some embodiments, the electrical parameter can be a breakdown voltage for the microcells and the relationship is a function of the output signal and a bias voltage applied to the microcells of the SSPM. In some embodiments, the electrical parameter is a capacitance for the microcells and the relationship is a function of a derivative of the output signal with respect to an overvoltage applied to the microcells of the SSPM.

In some embodiments, the light pulse can have a duration that is less than a recovery time of the SSPM. In some embodiments, the intensity of the light pulse can generate at least approximately ten primary electron-hole pairs for each of the microcells.

In some embodiments, a bias voltage can be applied to the microcells to configure the microcells in a Geiger mode of operation. In some embodiments, a bias voltage can be applied to the microcells to configure the microcells in a non-Geiger mode of operation.

In some embodiments, the SSPM can be incorporated into at least one of a nuclear detector or an optical detector.

In some embodiments, a bias voltage applied to the microcells can be adjusted to calibrate the gain of the microcells based on the value of the electrical parameter.

In some embodiments, the SSPM can be exposed to one or more light pulses having different intensities. The output signal of the SSPM generated in response to each of the one or more additional light pulses can be processed. A current of the output signal for each of the one or more light pulses can be evaluated as a function of an over voltage of the microcells and the value of the electrical parameter of the SSPM can be determined in response to each of the one or more light pulses to characterize the SSPM.

Any combination or permutation of embodiments is envisioned. Other objects and features will become apparent from the following detailed description considered in conjunction with the accompanying drawings. It is to be understood, however, that the drawings are designed as an illustration only and not as a definition of the limits of the invention.

DESCRIPTION OF EXEMPLARY EMBODIMENTS

Exemplary embodiments of the present disclosure are directed to characterizing and calibrating a solid-state photomultiplier (SSPM) using a high intensity light pulse that triggers the microcells of the SSPM to generate an output signal from the SSPM that is proportional to the gain and the quantity of microcells in the SSPM, where the output signal is a generally linear function of the over voltage. In exemplary embodiments, a duration of the high intensity light pulse can be less than a recovery time of the SSPM and the intensity of light pulse can be specified to be large enough to simultaneously trigger all microcells (e.g., ~10-30 primary e-h/u-cell/pulse). Exemplary embodiments can measure the response of the SSPM to different light pulse intensities and the response at the different intensities can be used to determine values for one or more electrical parameters (e.g., a breakdown voltage, capacitance).

For embodiments in which the amplitude of the output signal is large, a preamplifier is typically not required, even when the SSPM operates as a regular avalanche photodiode below the breakdown voltage. Exemplary embodiments of the present disclosure also advantageously allow investigation of an SSPM operating in linear and avalanche modes below (non-Geiger regime) and above breakdown voltage (Geiger regime) and can be useful for studying the breakdown avalanche process in SSPMs as well as transitions to the Geiger mode.

Figure 1:
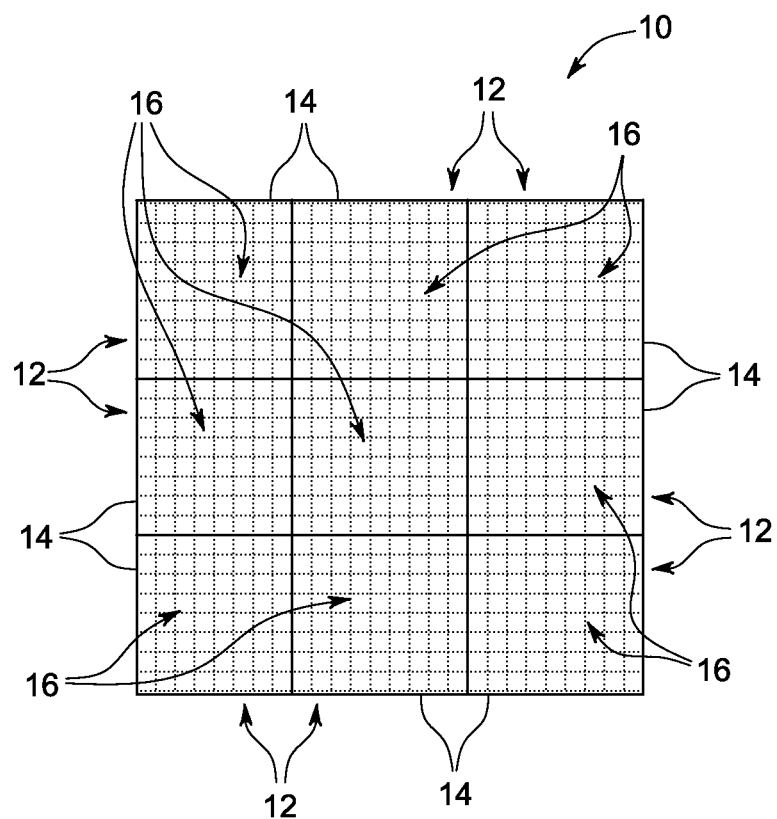
FIG. 1 illustrates a portion of an exemplary SSPM array in accordance with exemplary embodiments of the present disclosure.

FIG. 1 illustrates a portion of an exemplary SSPM array 10 in accordance with exemplary embodiments of the present disclosure. The array 10 can include pixel areas 12 and each pixel area 12 can include an SSPM 14. Each SSPM 14 can be formed of an array of microcells 16. The microcells 16 that form the SSPMs 14 can be implemented as a two dimensional array having a specified dimension, e.g., from about 10 to about 100 microns, and a specified spatial density, e.g., about 100 to about 1000/sq. mm. In some embodiments, the SSPM array 10 can be incorporated into a high energy detector, such as a scintillator-based detector or can be used for detecting single photons as an optical detector.

Figure 2:
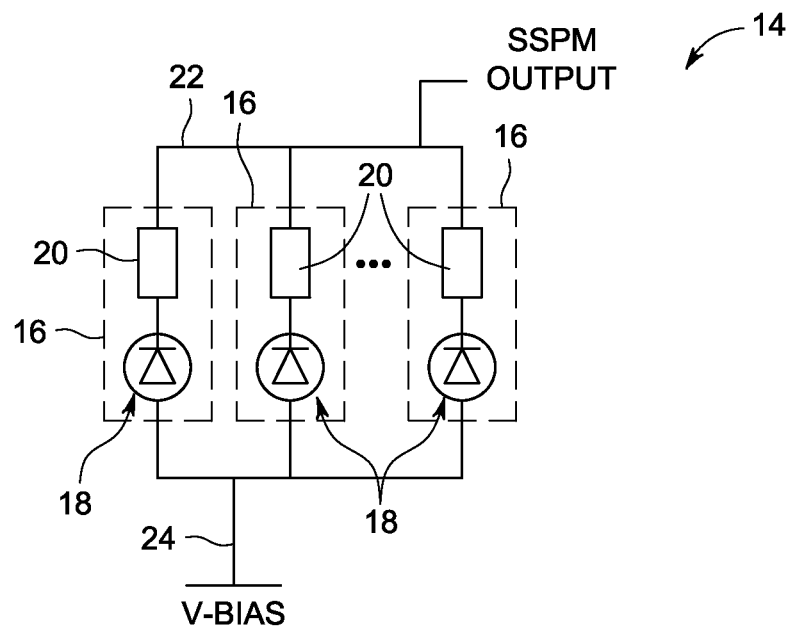
FIG. 2 illustrates an exemplary embodiment of an SSPM.

FIG. 2 illustrates an exemplary embodiment of one of the SSPMs 14 of FIG. 1. Each microcell 16 of the SSPM 14 can be formed by a Geiger-mode avalanche photodiode (APD) 18 and a quenching element 20. In exemplary embodiments, the APDs 16 of the microcells 16 can be formed using one or more semiconductor materials, such as Silicon (Si), Germanium (Ge), Indium Gallium Arsenide (InGaAs), Gallium nitride, Mercury Cadmium Telluride (HgCdTe), and/or any other suitable material(s). In one embodiment, the array of microcells 16 can be formed on a single semiconductor substrate to form the SSPM 14.

Each APD 18 in the microcells 16 can have a breakdown voltage of, for example, about 20 to about 2000 Volts and a bias voltage 24 can be applied to the microcells 16 to configure the APDs 18 in a reverse bias mode having an over voltage (i.e., the difference between the bias voltage and the breakdown voltage). The reverse biased APDs 18 can have an internal current gain of about 100 to about 1000 resulting from an avalanche effect within the APDs at bias voltage below breakdown. When they operate in Geiger mode, the gain of each microcell 16 is proportional to the over voltage and capacitance of micro-cell.

The quenching element 20 in each microcell 16 can be disposed in series between the bias voltage and the APD 18 and can operate to ensure that the APD 18 transitions to the quiescent state after a photon is detected. In exemplary embodiments, the quenching element can be a resistor, transistor, current controlled source, and/or any suitable device or devices for transitioning the APD 18 to the quiescent state after the APD 18 detects of a photon. The microcells 16 are connected to each other in parallel and share a common bias voltage and a common output. The output of each microcell 16 is used to generate an output 22 of the SSPM 14, which can be processed by readout circuitry.

Figure 3:
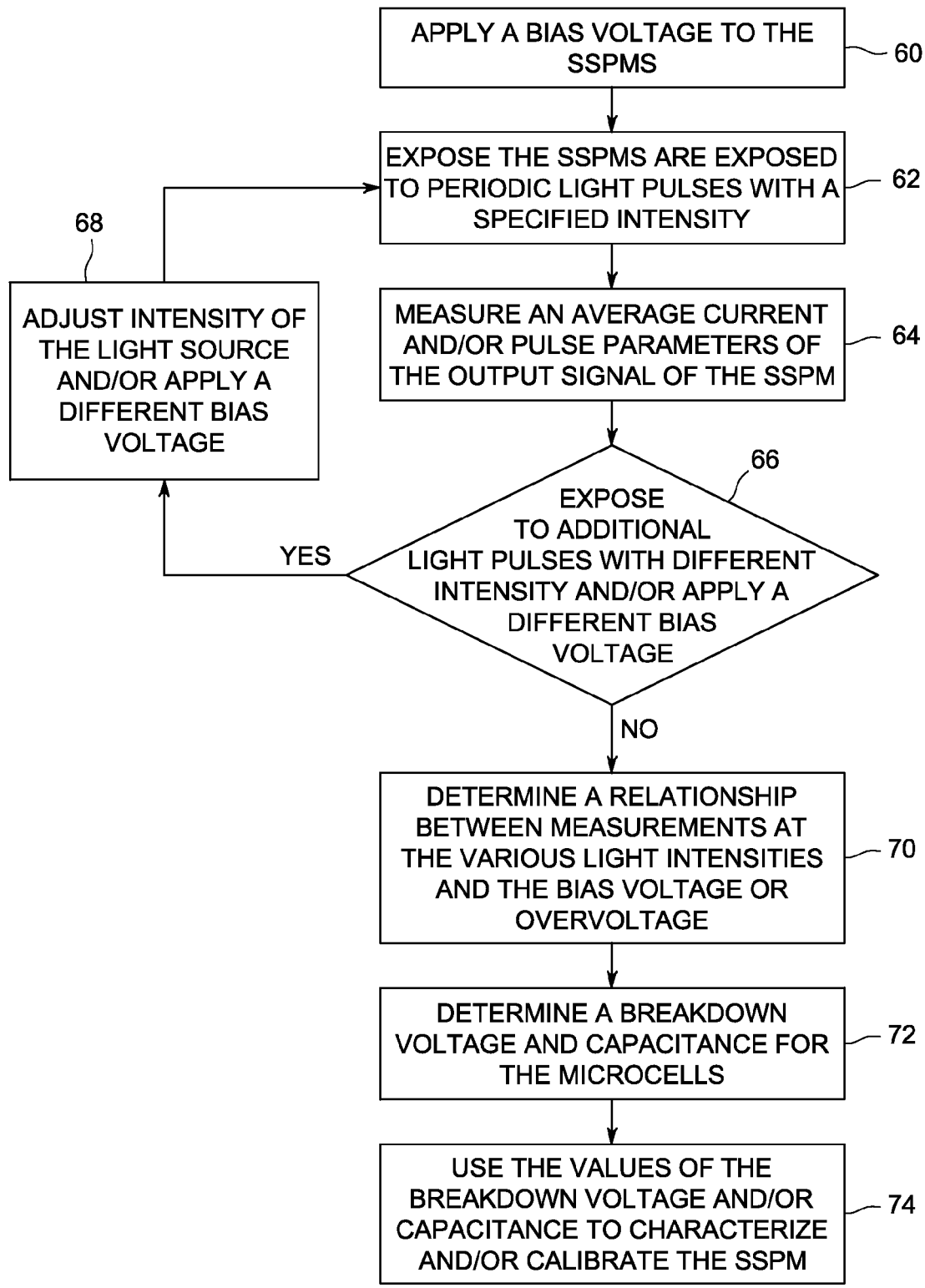
FIG. 3 is a flowchart illustrating an exemplary process for characterizing and/or calibrating an SSPM including an array of microcells.

FIG. 3 is a flowchart illustrating an exemplary process for characterizing and/or calibrating an SSPM including an array of microcells. Exemplary embodiments of the process can be implemented on standalone SSPMs, SSPMs incorporated into a nuclear detector (e.g., a PET scintillator-based detector), and/or SSPMs incorporated into an optical detection system (e.g., a light sensor). In step 60, a bias voltage is applied to the SSPMs to configure the APDs in a reverse bias mode. In step 62, the SSPMs are exposed to short periodic light pulses (e.g., about a 1 nanosecond pulse or less) with a specified intensity to concurrently saturate and trigger the microcells of the SSPM. In exemplary embodiments, the period between the pulses can be longer than the recovery time of the microcells and/or the duration of each light pulse can be shorter than the recovery time of the microcells.

Exposure of the SSPM to short periodic light pulses of a high intensity light source can generate a quantity of primary electron hole pairs in the APDs of the microcells of the one or more SSPMs. Each triggered microcell generates an output signal pulse corresponding to a gain of the microcells and it does not depend on a quantity of initial electron hole pairs in this microcell. In exemplary embodiments, all of the microcells of the SSPM can be triggered in response to the light source. The output signal pulses are combined to generate an output signal of the SSPM, which is proportional to a gain of the SSPM and a quantity of triggered microcells in the SSPM. In step 64, an average current and/or individual pulse parameters of the output signal of the SSPM are measured.

The probability of triggering a Geiger mode avalanche ($P_{Geiger}$) in the microcells in response to the high intensity light pulse that generates few electron-hole pairs per microcell can be represented mathematically as follows:

$$P_{Geiger}(N_{e\text{-}h}) = 1 - (1 - P_{Geiger}(1))^{N_{e\text{-}h}}, \quad (1)$$

where $N_{e\text{-}h}$ represents the quantity of electron-hole pairs generated in this microcell. The probability ($P_{Geiger}$) of triggering a Geiger mode avalanche increases significantly as the quantity of electron-hole pairs ($N_{e\text{-}h}$) increase and approaches 100% at even a very small over voltage ($V_{ov}$). Since the avalanche process quenches when the voltage across the APD drops below the breakdown voltage ($V_{br}$), a total charge and signal from each individual microcell does not depend on the quantity of initial electron-hole pairs ($N_{e\text{-}h}$).

In step 66, it is determined whether to expose the SSPM to another periodic light pulse having a different intensity and whether to apply a different bias voltage to the SSPM. In step 68, the intensity of the light source is adjusted and/or a different bias voltage is applied to the SSPM, and in step 62, the SSPM is exposed to another periodic light pulse having the specified intensity and/or a different bias voltage is applied, and in step 64, the average current and/or pulse parameters of the output signal generated by the SSPM are measured. Steps 62-68 can repeated for a specified number iterations and/or until it is determined that no further measurements are to be made. At step 70, a relationship between the average currents and/or pulse parameters measured at the various light intensities and the bias voltages or over voltages can be determined. In exemplary embodiments, the relationship can be represented graphical to show the current as a function of the bias voltage and/or the overvoltage (I-V curves). For example, the average current of the SSPM output signals corresponding to light intensities that trigger the microcells can have a generally linear relationship with the bias voltage. Using the relationship of the average currents to the bias voltage and/or over voltage, a break down voltage and capacitance for the microcells can be determined at step 72, as discussed in more detail below. The values of the breakdown voltage and/or capacitance can be used to characterize and/or calibrate the SSPM at step 74. While the present embodiment describes measuring an average current generated in response to a periodic light pulse, those skilled in the art will recognize that exemplary embodiments can be implemented to measure instantaneous current generated in response to a single light pulse or one or more light pulses.

For embodiments in which the SSPM is calibrated based on the values of the breakdown voltage and/or capacitance, a bias voltage to the SSPM can be adjusted based on the values of the breakdown voltage and/or capacitance to adjust a gain associated with the microcells of the SSPM. Exemplary embodiments of the present disclosure can advantageously facilitate a calibration a large area SSPM because the amplitude of the output pulse is approximately given by $V_{ov} \cdot R_{load}/(R_{load} + R_{quench}/N_{cell})$, which can be a few hundred millivolts at 50Ω termination resistance. Therefore, exemplary embodiments of the present disclosure can be implemented to calibrate a fully assembled SSPM-based detector because the amplitude of the calibration signals are comparable to an output signal resulting from scintillator pulses.

Figure 4:
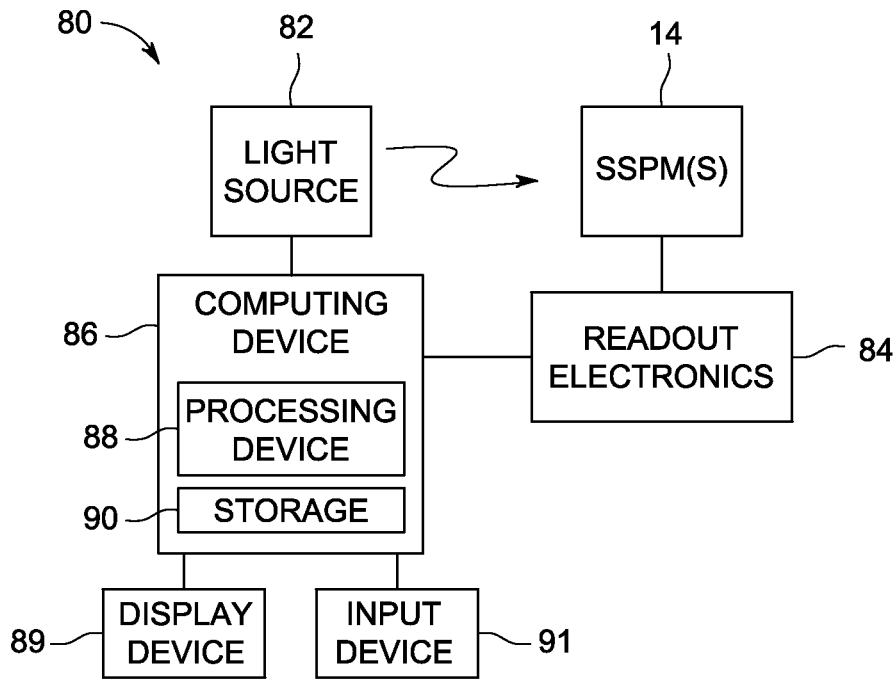
FIG. 4 is a block diagram of an exemplary system for characterizing and/or calibrating one or more SSPMs.

FIG. 4 is a block diagram of an exemplary system 80 for characterizing and/or calibrating one or more SSPMs. The system 80 can include a light source 82, readout electronics 84, and a computing device 86.

The light source 82 can be configured to emit light pulses at different intensities towards a solid state photomultiplier to trigger a plurality of microcells in one or more SSPMs. In one exemplary embodiment, a fast pulsed laser, such as pulsed laser model LDH-D-C from PicoQuant can be utilized. In some embodiments, the wavelength of the light radiated by the light source 82 can be 405 nanometers (nm) and a maximum pulse energy can be 50 pico-Joules (pJ) per pulse. A laser beam of the light source can be defocused to uniformly illuminate a sensitive area of one or more SSPMs. The pulse energy can be sufficient to produce greater than fifty electron-hole pairs ($N_{e\text{-}h} > 50$) per microcell when the SSPM is uniformly illuminated. A pulse repetition rate of ten kilo-Hertz (10 kHz) can be used so the that the one or more SSPMs can be recharged between light pulses and the average current through the one or more SSPMs can be sufficiently low to minimize a temperature change of a Silicon avalanche area.

The readout and measurement circuitry 84 ("circuitry 84") can be configured to measure electrical pulses output from SSPM(s) (e.g., output signals) in response to the light pulse impinging upon the APDs of the SSPM(s). The output signals of each one of the SSPMs can be proportional to a gain of the SSPM and a quantity of microcells in the respective SSPM. For embodiment in which the one or more SSPM are incorporated into a detector, the circuitry 84 can be formed by readout electronics of the detector (e.g., the electronics of the detector that would normally process photon events) and measurement electronics that are external to the detector. In some embodiments, at least a portion of the circuitry 84 can be configured to implement an averaging readout using a current and voltage sources (e.g. Keithley model 2400, 2601) to measure the electrical pulses output from the SSPM(s). The circuitry 84 can also include a load resistance (not shown), which can provide a termination at the input of the circuitry for the electrical pulses output from the SSPM(s).

Figure 8:
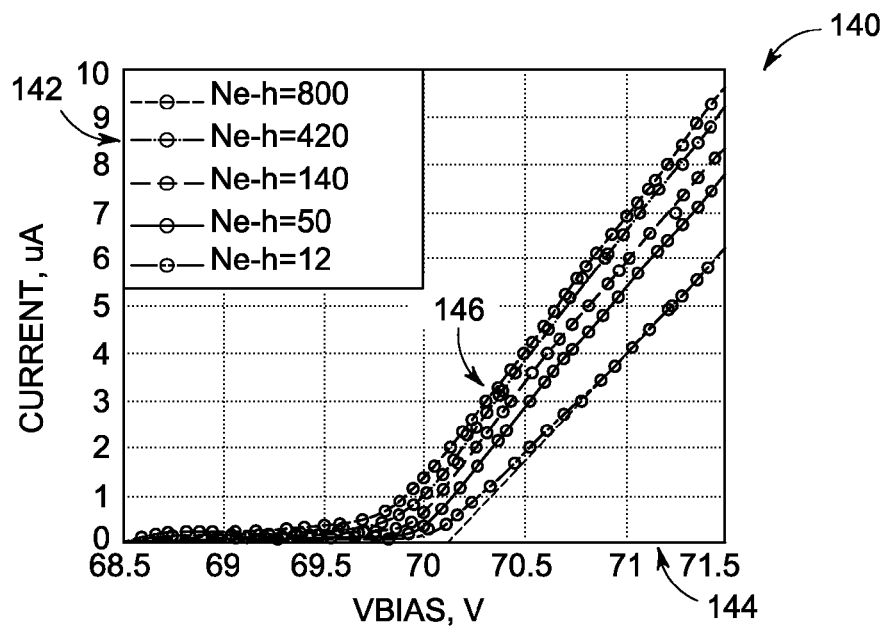
FIG. 8 shows a graph of the current as a function of a bias voltage for a measured output of an SSPM for different laser intensities.
Figure 10:
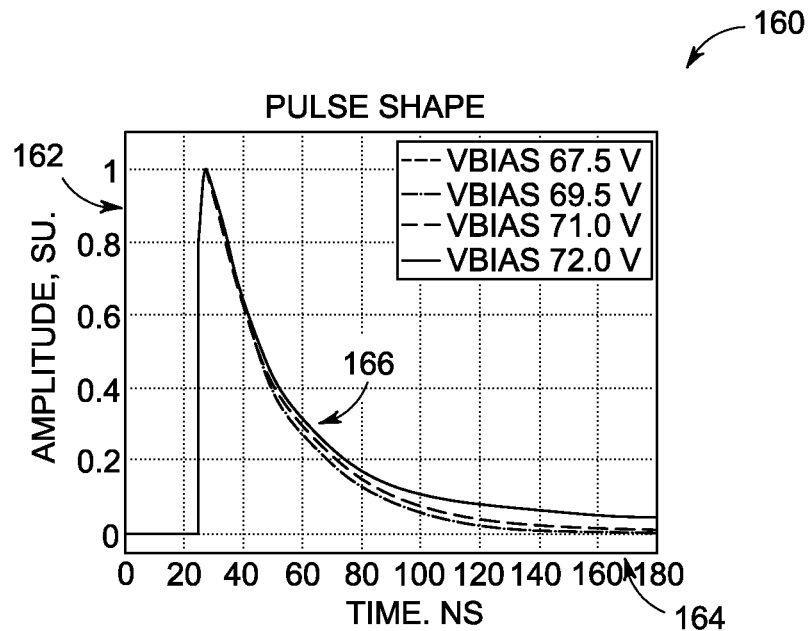
FIG. 10 shows a graph corresponding to measured output pulse signal shapes from an exemplary SSPM.
Figure 11:
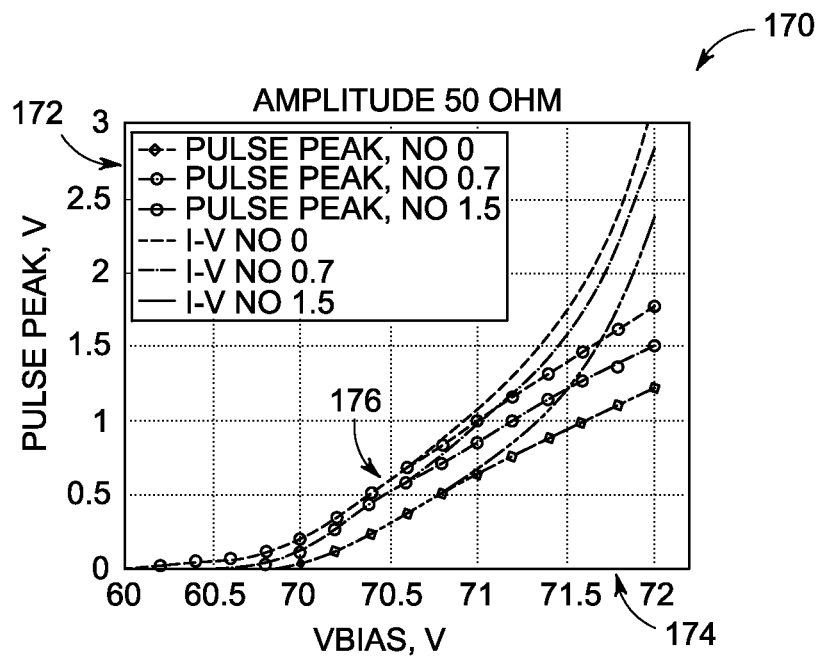
FIG. 11 shows a graph of a pulse amplitude and charge as function of the bias voltage for outputs pulse signals of an SSPM.

In exemplary embodiments, the readout circuitry 84 can operate in two modes: average current measurement mode or pulse measurement mode. When configured for average current measurements, front end electronics of the readout circuitry 84 can integrate the electrical pulses output from the SSPM(s) for long period of time (e.g. from 1 millisecond up to ten or more seconds) and can digitize the integrated signal. During the integration time, multiple calibration light pulses can illuminate the SSPM(s) and an average current can be measured. In this mode, the contribution of intrinsic dark current is measured and subtracted from calibration measurements. Because an average current is measured, the contribution of any after pulses cannot be directly estimated. FIG. 10, discussed in more detail below, illustrates an effect of after pulses on pulse shape at high over voltages. FIG. 11, discussed in more detail below, illustrate how after pulses affect the measurements in this mode. There is a deviation from linear behavior for a bias voltage of greater than about 71 volts (Vbias>71 V). FIG. 8, discussed in more detail below, illustrates that the high intensity light calibration process of the present disclosure together with high input impedance of readout circuitry 84 effectively increases recovery time for the SSPM(s). As a result, the effect of after pulses can be suppressed for high overvoltage values.

In an exemplary embodiment, the computing device 86 can include processing device 88 that is programmed to control emission of the light pulses from the light source 82 and/or control processing of the output signal by the readout circuitry 84. The processing device 88 of the computing device 86 can be programmed to determine an electrical parameter of the SSPM based on a relationship between the output signal of the SSPM and a bias voltage applied to the SSPM. The computing device 86 includes one or more non-transitory computer-readable storage media 90 for storing one or more computer-executable instructions or software that can be executed by the processing device 88 to implement exemplary embodiments. The storage 90 can store information, such as a sequence of light intensity values, SSPM output pulses, measured and/or calculated parameters of SSPMs and/or detectors incorporating SSPMs. A user may interact with the computing device 86 through a visual display device 89, such as a computer monitor, which may display one or more user interfaces that may be provided in accordance with exemplary embodiments. The computing device 86 may include other I/O devices for receiving input from a user (e.g., input device 91), for example, a keyboard or any suitable multi-point touch interface 208, a pointing device 210 (e.g., a mouse).

FIGS. 5-11 include simulated and measured results for an exemplary embodiment of the present disclosure. A Hamamatsu MPPC-S10985-050C SSPM was used for these experiments.

Figure 5:
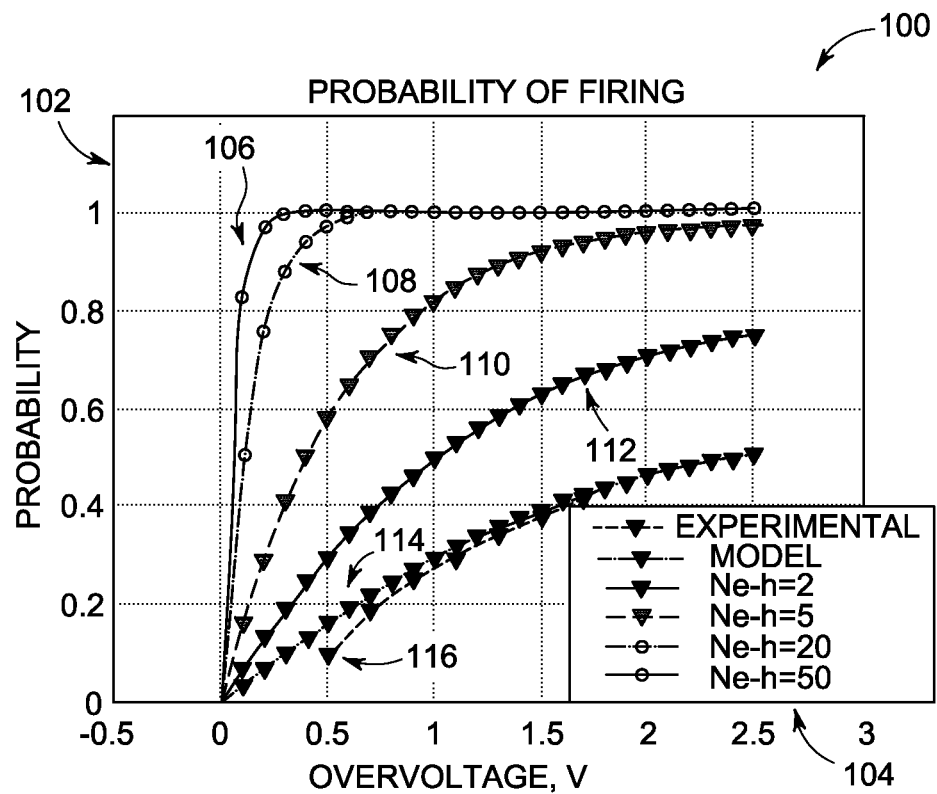
FIG. 5 shows exemplary simulation for the microcell triggering probability as function of light pulse intensity.

FIG. 5 shows a graph 100 modeling probabilities of triggering a Geiger mode avalanche ($P_{Geiger}$) in the microcells of an SSPM as a function of overvoltage. For modeling the probabilities, a measured Photo Detection Efficiency (PDE) as function of ($V_{ov}$) was used. A linear approximation is used to obtain values for PDE when the overvoltage is less than about 0.5 Volts. The y-axis 102 represents the microcell triggering probability and the x-axis 104 represents an over voltage in volts. As shown in the graph 100, as the overvoltage increases, the probability of triggering a Geiger mode avalanche in the microcells also increases. The probability is also a function of the number of initial electron-hole pairs that are created by a triggering event (e.g., one or more photons impinging upon the microcells). For example, the curves 106 and 108 correspond to triggering events in which fifty electron-hole pairs are generated and twenty electron-hole pairs are generated in microcell, respectively. As shown in the graph 100, the probability of triggering a Geiger mode avalanche for curves 106 and 108 increases to 100% for small over voltages (e.g., less than 0.5 Volts), whereas a larger overvoltage is required for curves 110 and 112, which correspond to triggering events that create five and two electron-hole pairs, respectively. Curve 114 corresponds to a simulated model probability of triggering a Geiger mode avalanche when approximately 0.1 initial electron-hole pairs are generated and curve 116 corresponds to an experimental probability of triggering a Geiger mode avalanche when approximately 0.1 initial electron-hole pairs are generated to illustrate the model closely reflects measured probabilities.

Figure 6:
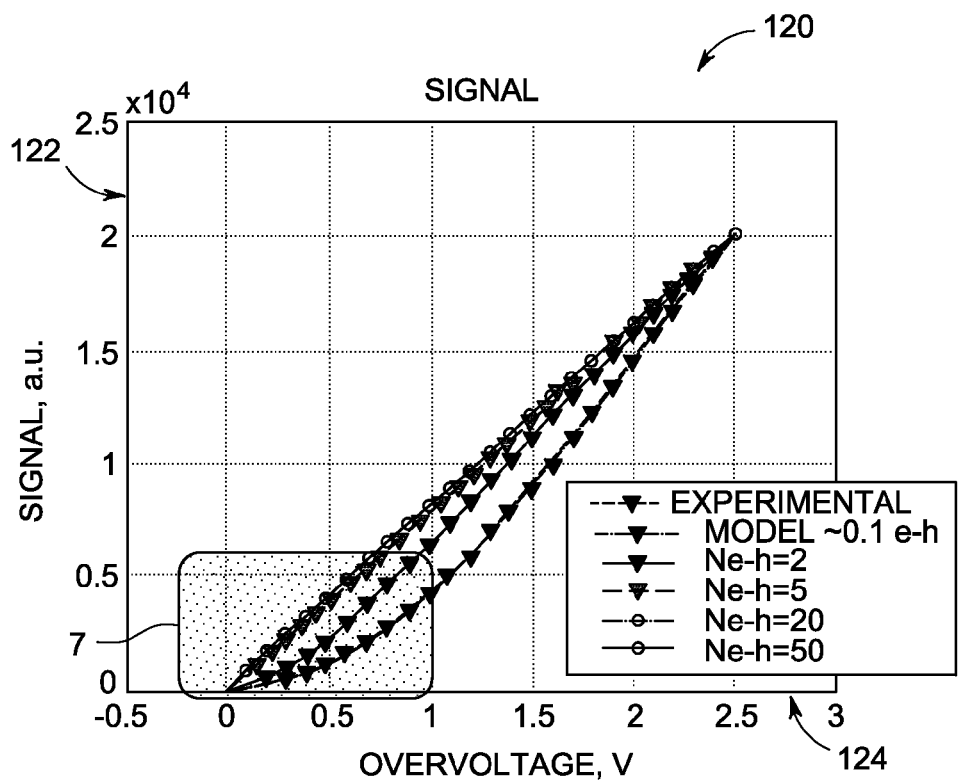
FIG. 6 shows a graph of current versus voltage for a simulated and experimental output of an SSPM exposed to different light intensities.
Figure 7:
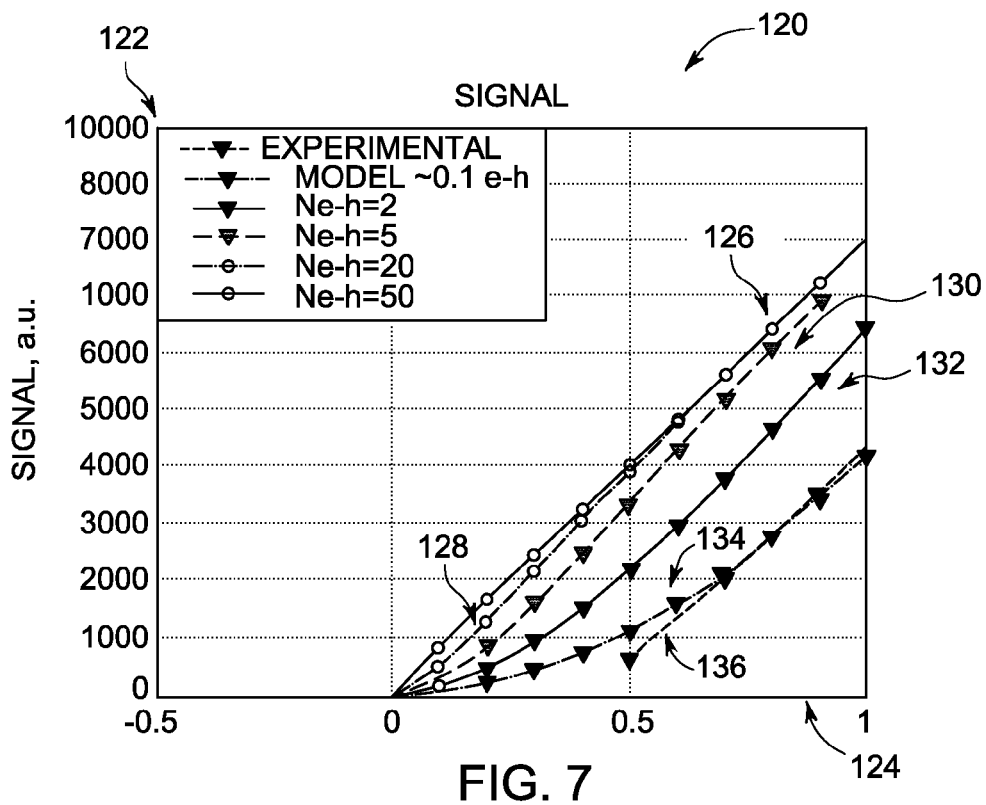
FIG. 7 shows the graph of FIG. 6 at a different scale.

FIGS. 6 and 7 show a graph 120, at different scales, to illustrate an expected signal amplitude for an SSPM as a function of overvoltage and electron-hole pairs generated. The y-axis 122 represents a signal amplitude and the x-axis 124 represents an over voltage in volts. The curves 126 and 128 correspond to triggering events in which fifty electron-hole pairs are generated and twenty electron-hole pairs are generated in each microcell, respectively. The curves 130 and 132 correspond to triggering events that create five and two electron-hole pairs, respectively. The curves 114 and 116 correspond to model and experimental triggering events, respectively, that create approximately 0.1 initial electron-hole pairs. As shown in graph 120 of FIGS. 6 and 7, light pulses with about 10 to about 30 initial electron-hole pairs ($N_{e-h}$ per microcell) can provide linear behavior for an overvoltage that is greater than 0.1 Volts ($V_{ov}>0.1V$) and signal does not depend on the light intensity.

Figure 9:
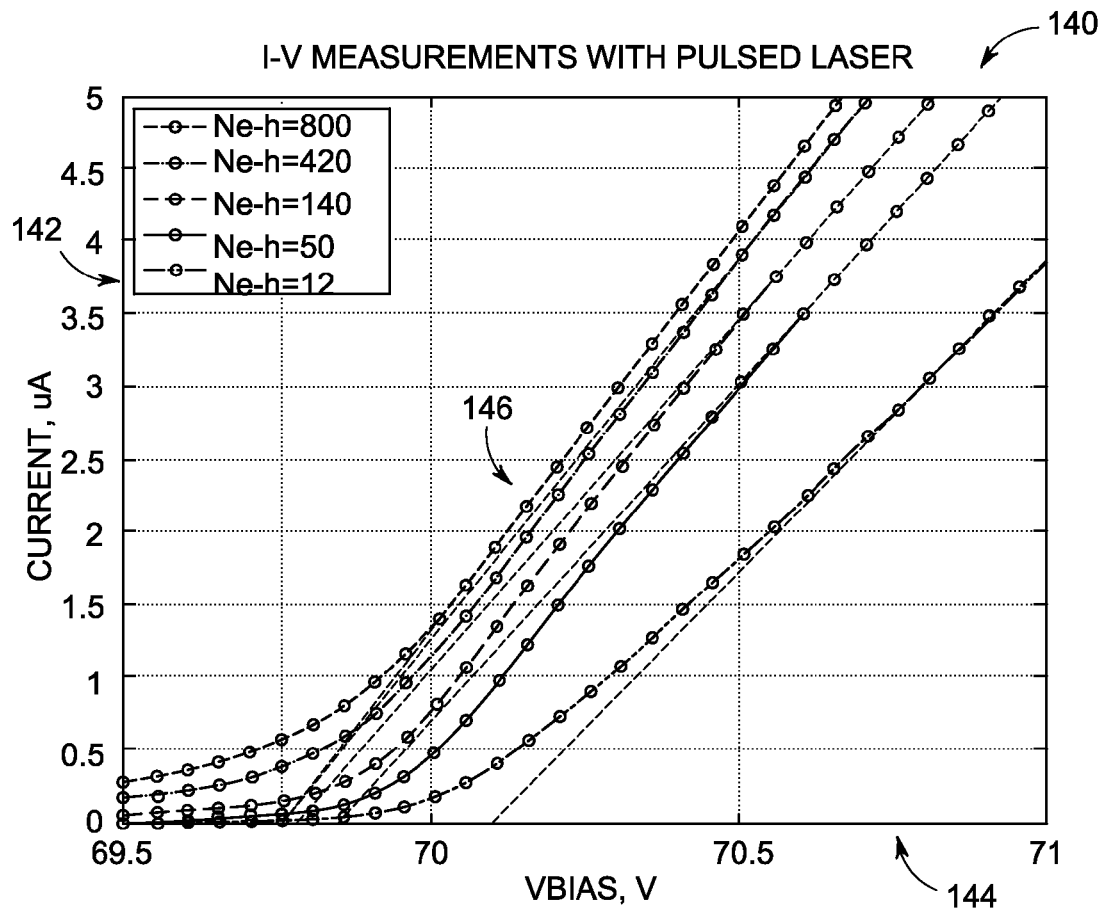
FIG. 9 shows the graph of FIG. 8 at a different scale.

FIGS. 8 and 9 show a graph 140, at different scales, of the current as a function of a bias voltage (I-V measurements) for an output of an SSPM for different laser intensities. FIGS. 8 and 9 presents exemplary I-V measurements performed with readout circuitry configured in an averaging mode. A small bias voltage (Vbias) e.g., about 10 Volts, can be applied to the SSPM to operate the SSPM in a photodiode mode (i.e., non-Geiger mode). At this small bias voltage, the photocurrent of the SSPM is measured with a gain of about one and can be used to calibrate the light source. The curves 146 correspond to an output of the SSPM for different light pulse intensities, which can be correspond to a quantity of electron-hole pairs that are generated in each microcell of the SSPM in response to the light pulse. The quantity of initial electron-hole pairs generated by the light pulses can be calculated from the measured photocurrent at small bias voltage using the following mathematical expression:

$$I_{SiPM} = N_{e-h} \cdot Q_e \cdot N_{cell} \cdot F_{rep},$$

where $N_{e-h}$—is the number of initial electron-hole pairs per pulse per microcell, $Q_e$ is the electron charge, $N_{cell}$ is the number of microcells per SSPM and $F_{rep}$ is the frequency of the calibration pulses. To obtain the above experimental data, a Hamamatsu 3×3 mm² SSPM device with 3600 microcells was used, so the photocurrent corresponding to 30 electron-hole pairs per microcell can be approximately 0.17 nano-Amperes ($I_{SiPM}=~0.17$ nA).

As shown in FIGS. 8 and 9, there is no indication of after pulsing at even high over voltages ($V_{ov}$). This can be explained by the high value for the load resistance $R_{load}$ (e.g., approximately 1 kΩ) used during for these measurements. Because all the microcells of the SSPM are triggered simultaneously, the recharging current for microcells is limited by $R_{load}$. The recharging time can be defined by the following mathematical expression:

$$\tau = (R_{load} \cdot N_{cell} + R_{quench}) \cdot C_{u-cell}.$$

For the SSPM used in these experiments, the recharging time with $R_{load}=1$ kΩ is approximately 325 ns. Because of this long recharging time the probability of after pulses is low even at an overvoltage of two volts ($V_{ov}=2V$).

The breakdown voltage can be determined by the voltage at which the slope of the current of the SSPM changes and over which the current increases in a generally linear manner. Above the breakdown voltage $V_{br}$, the SSPM operates as an avalanche photodiode in Geiger mode and the current is a linear function of the overvoltage $V_{ov}$. The slope of the I-V curve may not depend on the quantity of initial electron-hole pairs and can be determined using the following mathematical expression:

$$dI/dV = N_{cell} \cdot C_{u-cell} \cdot F_{rep}.$$

By measuring the slope dI/dV, the value of the capacitance of the microcells, $C_{u-cell}$, can be calculated. The results of breakdown voltage $V_{br}$ and estimated microcell capacitance $C_{u-cell}$ from a linear approximation of I-V curves are presented in Table. 1. The breakdown voltage $V_{br}$ measurements are in good agreement with the calibration based on the conventional single photon electron SPE method when the electron-hole pairs generated in accordance with exemplary embodiments of the present disclosure exceed fifty (Ne-h>50). The breakdown voltage $V_{br}$ measurements have a slightly higher value for smaller intensities. This deviation is similar to the modeling results when a small amount of electron-hole pairs ($N_{e-h}$) are generated as shown in FIG. 7 and can depend on the exact function of PDE ($V_{ov}$) for a small overvoltage ($V_{ov}$).

TABLE 1

The results of the measurements for different intensities

| $N_{e-h}$/u-cell/pulse | Effective $C_{u-cell}$ (fF) | $V_{br(V)}$ | dVpeak/dVbias |
|---|---|---|---|
| 800 | 152 fF | 69.76 | 0.9 |
| 420 | 145 fF | 69.76 | — |
| 140 | 132 fF | 69.78 | 0.75 |
| 50 | 122 fF | 69.85 | — |
| 12 | 97 fF | 70.05 | 0.6 |

For the Hamamatsu 3×3 mm² SSPM device used to in the experiments, the manufacturer provides that the capacitance of the microcells is equal 90 fF. The experimental results show that dI/dV value corresponds to the capacitance $C_{u-cell}$ of the microcell at small intensities (e.g., $N_{e-h}$~10) but yields slightly higher values when the number of initial electron-holes generated increases up to about 50. The significantly higher values were obtained at very high intensity of light pulses.

As discussed herein, when all the SSPM microcells are fired simultaneously, the amplitude of the output signal of the SSPM is large and pulse measurements can be performed directly, without amplification, using a fifty ohm (50Ω) termination. FIG. 10 shows a graph 160 including curves 166 corresponding to normalized output pulse signals from a Hamamatsu 3×3 mm² MPPC. The y-axis 162 corresponds to an amplitude of the output signals and the x-axis 164 corresponds to time in nanoseconds. For very high intensities, the pulses can be observed below the breakdown voltage Vbr when the SSPM operates in a non-Geiger avalanche mode.

The amplitude and total charge for each pulse can be measured. FIG. 11 shows a graph 170 of the pulse amplitude and charge as function of the bias voltage $V_{bias}$. The y-axis 172 corresponds to the pulse peak measured in volts and the x-axis 174 corresponds to the bias voltage in volts. The curves 176 correspond to an output of an SSPM at three different light intensities. At high bias voltages (e.g., $V_{bias}$>71V), the total charge deviates from linear behavior due to increased probability of after pulses. Since for pulse measurements, a load resistance of fifty ohms (Rload=50Ω) is used, the recharging time is thirty nanoseconds (τ~30 ns) and the after pulses start at a lower overvoltage. The after pulse effect can be clearly seen above a bias voltage for charge measurements of about seventy-one volts for I-V curves. The after pulses can be seen also as increased tail on FIG. 10.

Without after pulses, the voltage at the load resistance $R_{load}$ can be expressed mathematically as follows:

$$V_{Rload}=V_{OV} \cdot R_{load}/(R_{load}+R_{quench}/N_{cell}) \cdot \exp(-t/\tau),$$

where $\tau=(R_{load} \cdot N_{cell}+R_{quench}) \cdot C_{u-cell}$. Any after pulses does not change the peak amplitude but increase the charge and average current at high overvoltage. The pulse amplitudes shown in FIG. 11 are linear function of Vbias and not affected by after pulses and the slope of measured pulse amplitude can be mathematically expressed as follows:

$$dV_{pulse}/dV_{bias}=R_{load}/(R_{load}+R_{quench}/N_{cell}).$$

The slope may not depend on laser pulse intensity. The results of measured $dV_{pulse}/dV_{bias}$ are presented in Table 1. The expected ratio for slope is approximately 0.6 and is in a good agreement with the measurement. At higher quantities of electron-hole pair generation, the slope increases. In these models and experiments, it is assumed that the microcell discharge and the total charge for SSPMs operating in Geiger mode do not depend on the quantity of primary electron-holes that initiate the avalanche process.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other aspects, functions and advantages are also within the scope of the invention.

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than the order shown in the illustrative flowcharts.

The invention claimed is:

1. A method of characterizing a solid state photomultiplier (SSPM) comprising:
    exposing the SSPM to a light pulse that triggers a plurality of microcells of the SSPM, wherein an intensity of the light pulse generates at least two primary electron-hole pairs for each of the microcells;
    processing an output signal of the SSPM generated in response to the light pulse, the output signal being proportional to a gain of the SSPM and a quantity of microcells in the SSPM;
    applying a bias voltage to the SSPM to configure the plurality of microcells in a Geiger mode of operation; and
    determining a value of an electrical parameter of the SSPM based on a relationship between the output signal of the SSPM and a bias voltage applied to the SSPM.

2. The method of claim 1, wherein the electrical parameter is a breakdown voltage for the microcells and the relationship is a function of the output signal and the bias voltage applied to the SSPM.

3. The method of claim 1, wherein the electrical parameter is a capacitance for the microcells and the relationship is a function of a derivative of the output signal with respect to the bias voltage applied to the SSPM.

4. The method of claim 1, wherein the SSPM is incorporated into at least one of a nuclear detector or an optical detector.

5. The method of claim 4, further comprising adjusting the bias voltage applied to the SSPM in response to determining the value of the electrical parameter to calibrate the gain of the microcells.

6. The method of claim 1, further comprising:
    exposing the SSPM to one or more additional light pulses, each of the one or more additional light pulses having different intensities;
    processing an output signal of the SSPM generated in response to each of the one or more additional light pulses;

evaluating a current of the output signal for each of the one or more additional light pulses as a function of the bias voltage applied to the SSPM; and determining the value of the electrical parameter of the SSPM in response to each of the one or more additional light pulses to characterize the SSPM.

7. The system of claim 1, wherein the SSPM is incorporated into at least one of a nuclear detector or an optical detector.

8. The system of claim 7, further comprising adjusting the bias voltage applied to the SSPM in response to determining the value of the electrical parameter to calibrate the gain of the microcells.

9. The method of claim 1, wherein the light pulse has a duration that is less than a recovery time of the SSPM.

10. A system for determining an electrical parameter of a solid state photomultiplier comprising:
   a light source configured to emit light pulses at different intensities towards a solid state photomultiplier to trigger a plurality of microcells in the SSPM, wherein the different intensities of the light pulses emitted by the light source generates at least two primary electron-hole pairs for each of the microcells;
   circuitry configured to process an output signal of an SSPM, the output signal being proportional to a gain of the SSPM and a quantity of microcells in the SSPM; and
   a processing device programmed to control emission of the light pulses from the light source and control processing of the output signal by the circuitry and to determine an electrical parameter of the SSPM based on a relationship between the output signal of the SSPM and a bias voltage applied to the SSPM, wherein the application of the bias voltage configures the plurality of microcells in a Geiger mode of operation.

11. The system of claim 10, wherein the electrical parameter is a breakdown voltage for the microcells and the relationship is a function of the output signal and the bias voltage applied to the SSPM.

12. The system of claim 10, wherein the electrical parameter is a capacitance for the microcells and the relationship is a function of a derivative of the output signal with respect to the bias voltage applied to the SSPM.

13. The system of claim 10, wherein the different intensities of the light pulses emitted by the light source generates at least approximately ten primary electron-hole pairs for each of the microcells.

14. The system of claim 10, wherein the processing device is programmed to evaluate a current of the output signal for each of the light pulses as a function of the bias voltage applied to the SSPM and determine the value of the electrical parameter of the SSPM in response to each of the light pulses to characterize the SSPM.

15. The system of claim 10, wherein the processing device is programmed to evaluate an average current over a specified time period of the output signal for the light pulses as a function of the bias voltage applied to the SSPM and determine the value of the electrical parameter of the SSPM in response to the light pulses to characterize the SSPM.

16. The system of claim 10, wherein the light pulse has a duration that is less than a recovery time of the SSPM.

* * * * *